United States Patent [19]
Kyozuka et al.

[11] Patent Number: 5,783,838
[45] Date of Patent: Jul. 21, 1998

[54] NON-SINGLE CRYSTALLINE SEMICONDUCTOR PHOTO DETECTOR WITH SUPER LATTICE

[75] Inventors: Shinya Kyozuka; Takeshi Nakamura; Takayuki Yamada; Yasuaki Miyamoto, all of Ebina, Japan

[73] Assignee: Fuji Xerox Co., Ltd., Tokyo, Japan

[21] Appl. No.: 739,194

[22] Filed: Oct. 30, 1996

[30] Foreign Application Priority Data

Dec. 28, 1995 [JP] Japan ................... 7-343313

[51] Int. Cl.$^6$ .................. H01L 27/14; H01L 29/04; H01L 29/15
[52] U.S. Cl. ................... 257/21; 257/16; 257/22; 257/438; 257/442
[58] Field of Search ............... 257/16, 21, 22, 257/438, 442

[56] References Cited

U.S. PATENT DOCUMENTS

| | | |
|---|---|---|
| 5,187,553 | 2/1993 | Makita ........................ 257/21 |
| 5,453,629 | 9/1995 | Gofuku ........................ 257/438 |
| 5,457,327 | 10/1995 | Taguchi ........................ 257/21 |
| 5,481,124 | 1/1996 | Kozuka et al. ............... 257/438 |

FOREIGN PATENT DOCUMENTS

| | | |
|---|---|---|
| A-2-3497 | 2/1990 | Japan. |
| A-3-253082 | 11/1991 | Japan. |

OTHER PUBLICATIONS

IEEE Transactions on Electron Devices, vol. 35, No. 8, Aug. 1988, "Amphorous Silicon/Silicon Carbide Superlattice Avalanche Photodiodes", JWO et al., pp. 1279–1283.

ITE'95: 1995 ITE Annual Convention, Annual Meeting Preprint of the Television Society, "Photocurrent Multiplication of a Si:H Staircase Photodiodes", Sawada et al., pp. 73–74.

*Primary Examiner*—Gene M. Munson
*Attorney, Agent, or Firm*—Oliff & Berridge

[57] ABSTRACT

Described is a semiconductor photo detector comprising, between two electrodes, at least one of said electrodes being a transparent electrode, an optical absorption layer which is composed of a non-single crystalline material, absorbs light and generates photo carriers and a carrier multiplication layer which is composed of a non-single crystalline material and multiplies the photo carriers generated by the optical absorption layer. The carrier multiplication layer is formed of a multilayer film obtained by stacking films each having plural layers which are composed of non-single crystalline $Zn_xCd_{1-x}M$ ($0 \leq x \leq 1$, M represents one selected from the group consisting of S, Se and Te) and are different in a composition ratio in accordance with a change in the value of x in said $Zn_xCd_{1-x}M$, whereby a band discontinuity $\Delta Ec$ of the conduction band can be made larger, an ionization rate of electrons can be heightened and the place where ionization occurs can be specified. As a result, sensitivity increase, noise reduction and low voltage drive can be attained.

10 Claims, 9 Drawing Sheets

NON-SINGLE CRYSTALLINE SEMICONDUCTOR PHOTO DETECTOR WITH SUPER LATTICE

BACKGROUND OF THE INVENTION

1. Field of the Invention

This invention relates to a semiconductor photo detector for use in a line image sensor for image reading of a copying machine, facsimile or the like, or for use in a two-dimensional image sensor for image input of a video camera or the like, particularly to a semiconductor photo detector making use of an avalanche effect for amplifying optically formed carriers by impact ionization.

2. Description of the Related Art

A photo diode making use of an avalanche multiplication effect (said diode will hereinafter be abbreviated as "APD") has attracted attentions as a highly-sensitive semiconductor photo detector capable of detecting feeble light. As this APD, there exists, as illustrated in FIG. 9($a$), a single crystalline Si pin APD comprising an n$^-$ electrode 201 made of silicon to which impurities have been doped, an SiO$_2$ layer 202, an n$^+$ layer 203, a p layer 204 which will be an avalanche region, a p$^-$ layer 205 which will be an optical absorption region, a p$^+$ substrate 206 and a p$^-$ electrode 207 made of silicon to which impurities have been doped.

FIG. 9($b$) is a schematic diagram illustrating the band structure of the above APD at the time when reverse bias is applied. The incident light irradiated from the side of the n$^-$ electrode 201 is absorbed by the p$^-$ layer 205 (which will be an optical absorption layer), whereby photoelectric conversion is conducted. An electron and hole, which have been formed in the player 205 in a pair, travel toward the n$^-$ electrode 201 and the p$^-$ electrode 207, respectively. The p layer 204 (which will be a carrier multiplication layer) has a strong electric field so that there appears an avalanche phenomenon, that is the phenomenon forming a large number of electron-hole pairs by the impact ionization during the traveling of electrons, leading to the occurrence of a multiplication effect for forming a plurality of electron-hole pairs per photo quantum.

The multiplication factor at this time depends on the ionization rate a. The larger the $\alpha$ is, the higher multiplication factor can be obtained. The term "ionization rate" as used herein means the number of electron-hole pairs formed at the time when one electron travels for a unit distance by impact ionization. The ionization rate a shows an exponential increase with the increase in the strength of the electric field so that the larger multiplication factor can be obtained by increasing the electric field.

The single crystalline Si pin APD has been industrialized as a highly-sensitive semiconductor photo detector which has sensitivity to a range of from visible light to near infrared rays ($\lambda$=0.45-1.0 μm) and can detect a feeble incident light. It is, however, accompanied with the following drawbacks:

(1) it requires a high driving voltage (~100V) because a high electric field is applied by the externally applied voltage to cause impact ionization of carriers;

(2) owing to the operation in the high electric field, leakage current (dark current) generated at the time when no light is irradiated is large; and (3) avalanche amplification is accompanied with the occurrence of noise (excess noise), which lowers a signal to noise ratio (SN ratio).

According to the report of R. J. McIntyre in "IEEE Transactions Electron Device, 13, 164(1966)", it has been elucidated that when the ionization rate of electrons and that of holes are expressed as $\alpha$ and $\beta$, respectively, the excess noise generated during the above-described avalanche multiplication depends on the ratio of these ionization rates (impact ionization coefficient ratio) k=$\alpha/\beta$ and, and in order to decrease the excess noise, the ratio k may be lowered for the electron multiplication while it may be raised for the hole multiplication, in other words, the ionization rate of one of the carriers (electrons or holes) to be multiplied may be increased.

In the case of single crystalline Si, the ionization rate $\alpha$ of electrons is much larger than the. ionization rate $\beta$ of holes so that it is necessary to increase only the a to decrease the excess noise. In the single crystalline Si pin APD, however, the ionization rate a of electrons and ionization rate $\beta$ of holes are determined according to the electric field strength of the avalanche region so that it is impossible to control the values of $\alpha$ and $\beta$ independently and the larger the electric field strength, the larger the value of k. In other words, as the electric field strength is heightened to obtain larger multiplication, the excess noise increases, inevitably leading to a reduction in an SN ratio.

The above-described report further describes that when only one of the carrier is multiplied, the excess noise index F becomes 2. In the case of ideal, noise-free multiplication, the index F may be 1 so that according to the above description, there remains somewhat noise generating mechanism in the above case. It is considered as the generating mechanism that the place where ionization occurs fluctuates within the semiconductor photo detector so that the whole multiplication factor fluctuates, in other words the fluctuation becomes a noise source. It is considered that to suppress the fluctuation and to obtain a higher SN ratio, specification of the place where ionization occurs within the detector is effective.

With a view to overcoming the problems of the above-described single crystalline Si pin APD, an APD using a super-lattice structure of an amorphous Si base semiconductor is proposed in "IEEE Trans. Electron Devices, 35, 1279(1988)". A description will next be made of this APD, with reference to FIGS. 10($a$)–($c$).

The APD using a super-lattice structure of an amorphous Si-base semiconductor comprises, as illustrated in FIG. 10($a$), a transparent electrode 302 made of ITO, a p$^+$a—Si:H layer 303, a supper lattice layer 306 serving as both an optical absorption layer and a carrier multiplication layer, an n$^+$a—Si:H layer 307 and an electrode 308 formed of Al, all of them being stacked one after another on a glass substrate 301. The super-lattice layer 306 is formed of an a—Si:H layer 304 which will be a well layer and an a—SiC:H layer 305 which will be a barrier layer, said layers being stacked alternately to be 10 layers in total. The p$^+$a—Si:H layer 303 and the transparent electrode 302, and the n$^+$a—Si:H layer 307 and the electrode 308 are each constructed to form an ohmic contact.

FIG. 10($b$) is a schematic diagram illustrating the band structure of the above-described APD at the time when no voltage is applied. In the diagram, the discontinuities of the energy band of the conduction band and valence band in the hetero junction between a—Si:H and a—SiC:H are expressed by $\Delta$Ec and $\Delta$Ev, respectively. Concerning the band discontinuity in the a—Si:H/a—SiC:H hetero junction, that of the conduction band is larger, and $\Delta$Ec is 0.35 eV and $\Delta$Ev is 0.10 eV.

FIG. 10($c$) is a schematic diagram illustrating the band structure of the above-described APD at the time when reverse bias is applied. The incident light irradiated from the side of the p⁺a—Si:H layer 303 is absorbed by the super-lattice layer 306, whereby optoelectric conversion is conducted. An electron and a hole, which have been formed in a pair, travel toward the n⁺a—Si:H layer 307 and the p⁺a—Si:H layer 303, respectively. When electrons accelerated by the electric field enter into the well layer 304 from the barrier layer 305 of the super lattice layer 306, their energy condition becomes higher by $\Delta Ec$, that is, the band discontinuity of the conduction band, which heightens the ionization rate $\alpha$ of electrons in proportion. The repetition of the above-described procedure for electrons increases the number of the carriers.

In the case of holes, on the other hand, no such phenomenon occurs because the band discontinuity $\Delta Ev$ of a valence band is small. According to the above-described APD structure, only the ionization rate $\alpha$ of electrons can be increased and furthermore, the place where ionization occurs can be specified at the hetero junction so that high sensitivity and low excess-noise properties can be attained. In addition, carriers receive energy from the band offset of the hetero structure so that the electric field strength necessary for the ionization of carriers can be reduced, which enables low voltage drive.

In the report by Sawada et al. In "Annual Meeting Preprint of the Television Society, 1995, p73", described is an APD having a graded super-lattice structure in which in an a—Si:H/a—SiC:H super lattice, a barrier layer has a saw-tooth potential structure. A description will next be made of this APD with reference to FIGS. 11(a)–(c).

The APD having a graded super-lattice structure is formed of an i-type a—Si:H 402, a graded supperlattice layer 405 serving as an optical absorption layer and a carrier multiplication layer, i-type a—Si:H 406, a p-type semiconductor layer 407 and a transparent electrode 408 made of Au, all of them being stacked one after another on an n-type single crystalline Si substrate 401. The graded super-lattice layer 405 is constructed of an i-type a—Si:H layer 404 which will be a well layer and an i-type a—Si$_{1-x}$C$_x$:H (x=0–1) layer 403 which will be a barrier layer, said layers being stacked alternately to 6 layers in total.

FIG. 11(b) is a schematic diagram illustrating the band structure of the above-described APD at the time when no voltage is applied. The band structure of the graded super-lattice can be imparted with a sawtooth structure by successively changing the composition ratio of the a—Si$_{1-x}$C$_x$:H layer within a range of x=0–1 at the time when the i-type a—Si$_{1-x}$C$_x$:H (x=0–1) layer 403 is deposited as a barrier layer.

FIG. 11(c) is a schematic diagram illustrating the band structure of the above-described APD at the time when reverse bias is applied. The avalanche multiplication mechanism is fundamentally equal to that of the super-lattice APD illustrated in the above FIG. 10. In this detector, however, there does not exist an energy barrier against electrons at the hetero junction in the traveling direction of electrons, which makes it possible to avoid cooling of electrons by which energy is lost at the time when electrons enter from the well layer 404 to the barrier layer 403, and to prevent electrons from not being taken externally as signals owing to the accumulation of electrons in the well layer 404. It is therefore possible to conduct a sensitivity increase and a reduction in noise furthermore.

As described above, the super lattice structure of an amorphous Si-base semiconductor makes it possible to actualize a free band structure because of being free from the mismatching of a lattice constant and therefore to provide an APD which has high sensitivity to visible light, a high SN ratio and can be driven at low voltage. Such APD is however accompanied with the problems as described below.

In the above-described super-lattice APD employing an amorphous Si-base semiconductor, the discontinuity of the conduction band is about 0.34 eV, which is smaller than that of the bandgap (Eg=1.70 eV) of an i-type a—Si:H which is a well layer. So, the ionization does not always occur at the hetero junction and effects for the noise reduction are insufficient. In order to obtain a high ionization rate, it is necessary to add electric field of some extent to a carrier multiplication layer, which makes it difficult to drive the APD at low voltage. The application of a high electric field to the carrier multiplication layer causes problems such as an increase in the dark current and a reduction in the SN ratio owing to the ionization of holes by the electric field.

In the case of the super-lattice APD employing an amorphous Si-base semiconductor, each of the super lattice layer 306 and 405 serves as an optical absorption layer and a carrier multiplication layer so that when the carrier multiplication layer absorbs incident light to generate photo carriers (electron and hole pairs), the multiplication factors of the photo carriers so generated differ with the place where absorption has occurred. The photo carriers generated at the place closer to the optical absorption layer travel for a longer distance through the carrier multiplication layer, thereby receiving large multiplication.

The incident light having shorter wavelength is absorbed in the more vicinity of the surface so that the multiplication factor increases for the light of the shorter wavelength while it decreases for the light of the longer wavelength. In short, the fluctuations in the multiplication factor occur depending on the wavelength of the incident light.

It is desired to inject only the carriers to be multiplied into the carrier multiplication layer in order to effect noise reduction and photo carriers formed in the carrier multiplication layer cause a reduction in the SN ratio.

SUMMARY OF THE INVENTION

The present invention has been completed with the foregoing in view. An object of the present invention is to provide a semiconductor photo detector which is highly sensitive and has low noise, particularly to the visible light, and has less fluctuations in the multiplication factor depending on the wavelength of the incident light.

With a view to attaining the above objects, the present invention provides a semiconductor photo detector which comprises, between two electrodes, at least one of said electrodes being transparent, an optical absorption layer which is formed of a non-single crystalline material, absorbs light and generates photo carriers; and a carrier multiplication layer which is composed of a non-single crystalline material and multiplies the photo carriers generated by the optical absorption layer.

More specifically, the carrier multiplication layer is formed of a multilayer film obtained by stacking films each having plural layers which are composed of non-single crystalline $Zn_xCd_{1-x}M$ ($0 \leq x \leq 1$, M represents one selected from the group consisting of S, Se and Te) and are different in a composition ratio in accordance with a change in the value of x in said $Zn_xCd_{1-x}M$.

According to the semiconductor photo detector of the present invention, the carrier multiplication layer is composed of a multilayer film obtained by stacking films, each of which has plural layers of non-single crystalline $Zn_xCd_{1-x}M$ ($0 \leq x \leq 1$, M is the one selected from the group consisting of S, Se and Te) different in the composition ratio so that the band discontinuity ΔEc of the conduction band can be made larger, which makes it possible to heighten the ionization rate of electrons and to specify the place where ionization occurs, thereby attaining sensitivity increase and noise reduction and furthermore, low voltage drive.

In addition, the bandgap of the carrier multiplication layer is larger than that of the optical absorption layer, which makes it possible to provide a semiconductor photo detector free from the generation of photo carriers in the carrier multiplication layer, has less fluctuations in the multiplication factor depending on the wavelength of the incident light, and is low noise.

At the junction between the optical absorption layer and the carrier multiplication layer, the conduction band of the carrier multiplication layer can be positioned below the optical absorption layer, and there exists no energy barrier against electrons in the above junction so that cooling or accumulation of the electrons at this part can be prevented and sensitivity increase and noise reduction can be attained.

According to the semiconductor photo detector of the present invention, an energy band structure being large in the band discontinuity of the conduction band but small in that of the valence band can be obtained by forming the carrier multiplication layer from a multilayer film obtained by stacking films, each film having plural layers which are composed of non-single crystalline $Zn_xCd_{1-x}S$ in which the value of x has been changed and therefore are different in a composition ratio, whereby high sensitivity, low noise and low voltage drive can be attained.

In addition, the semiconductor photo detector which has low dark current, is free from generation of photo carriers in the carrier multiplication layer, has a few fluctuations in the amplification factor depending on the wavelength of the incident light and has low noise can be obtained because the carrier multiplication layer has a large bandgap.

Furthermore, according to the semiconductor photo detector of the present invention, an energy band structure being large in the band discontinuity of the conduction band but small in that of the valence band can be obtained by forming the carrier multiplication layer from a multilayer film obtained by stacking films, each film having plural layers which are composed of non-single crystalline $Zn_xCd_{1-x}Se$ or non-single crystalline $Zn_xCd_{1-x}Te$ in which the value of x has been changed and therefore are different in a composition ratio, whereby high sensitivity, low noise and low voltage drive can be attained.

DETAILED DESCRIPTION OF THE PREFERRED EMBODIMENTS

Figure 1A:
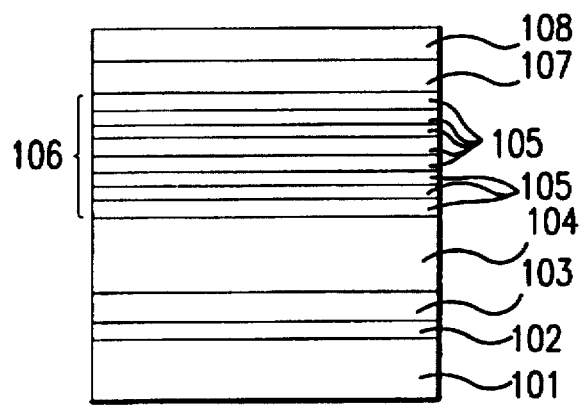
FIG. 1(a) is a schematic cross-sectional view illustrating the structure of the semiconductor photo detector according to the present invention, (b) is an energy band diagram illustrating the band structure of the semiconductor photo detector at the time when no voltage is applied, and (c) is an energy band diagram illustrating the band structure of the semiconductor photo detector at the time when reverse bias is applied.
Figure 1B:
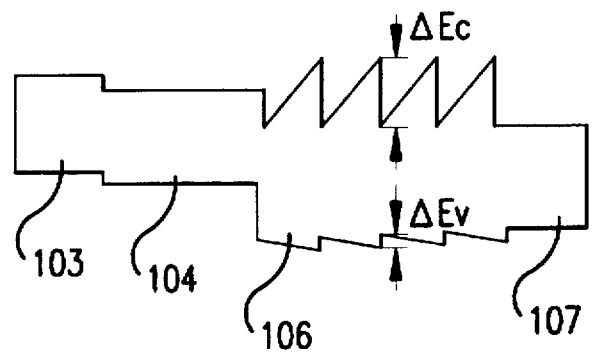
Figure 1C:
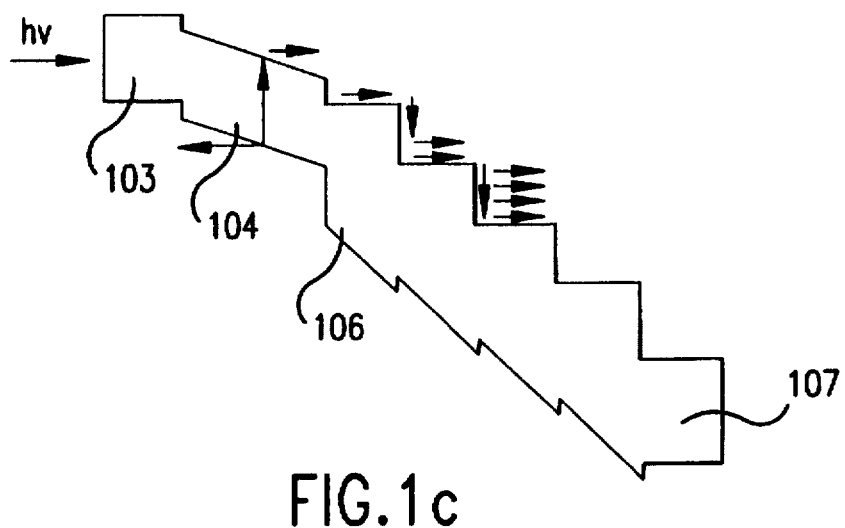

A description will next be made of the structure and band structure of one embodiment of the semiconductor photo detector according to the present invention, with reference to FIGS. 1(a)–(c). FIG. 1(a) is a cross-sectional view illustrating the structure of the semiconductor photo detector according to the present invention, FIG. 1(b) is a schematic diagram illustrating the band structure of the semiconductor photo detector at the time when no voltage is applied, and FIG. 1(c) is a schematic diagram illustrating the band structure of the semiconductor photo detector at the time when reverse bias is applied.

The semiconductor photo detector according to the present invention is formed of a transparent electrode 102, a p-type semiconductor layer 103 which will be a blocking layer, an optical absorption layer 104, a carrier multiplication layer 106, an n-type semiconductor layer 107 which will be a blocking layer and an electrode 108, all of them being electrically connected each other on a substrate 101.

The carrier multiplication layer 106 is formed of a multilayer film obtained by stacking plural layers of a non-single crystalline $Zn_xCd_{1-x}S$ layer 105. The composition ratios of $Zn_xCd_{1-x}S$ are changed successively ($0 \leq x \leq 1$) at the time when each $Zn_xCd_{1-x}S$ layer 105 is deposited, whereby a super lattice having a periodically changing energy band is formed. When in a $Zn_xCd_{1-x}S$ layer, x is set at 0 on the side of the optical absorption layer 104 and x is set at 1 on the side of the n-type semiconductor layer 107, the end portion on the side of the optical absorption layer 104 becomes a CdS film and the end portion on the side of the n-type semiconductor layer 107 becomes a ZnS film, whereby an energy band showing an increase in the right side in FIG. 1(b) is formed and the band discontinuity $\Delta Ec$ at the hetero junction of the carrier multiplication layer 106 becomes 0.89 eV. The bandgap Eg of the carrier multiplication layer 106 on the other hand becomes 2.53 (CdS film)–3.54 (ZnS film) eV.

The optical absorption layer 104 is formed of a non-single crystalline material such as a polycrystalline material, amorphous material or micro-crystalline material, for embodiment of an a—Si film having high sensitivity to the visible light. The above-described semiconductor photo detector can be converted into the super-lattice APD free from the problem of lattice mismatching by forming the optical absorption layer 104 and the carrier multiplication layer 106 using a non-single crystalline material.

A description will next be made of the effects of the semiconductor photo detector according to the present invention.

The operation mechanism of the avalanche multiplication is similar to that of the conventional super lattice APD using an amorphous Si-base semiconductor. Out of the photo carriers generated in the optical absorption layer 104, electrons enter into the carrier multiplication layer 106 having a super lattice structure and receive the ionization energy from the band discontinuity of the conduction band in the super-lattice structure, whereby avalanche multiplication is effected. At this time, according to the structure of the semiconductor photo detector, non-single crystalline $Zn_xCd_{1-x}S$ super lattice is used as the carrier multiplication layer 106 so that the band discontinuity $\Delta Ec$ of the carrier multiplication layer 106 at the hetero junction is 0.89 eV and receives a large ionization energy at the hetero junction, whereby a large multiplication effect can be attained and therefore highly-sensitive properties can be obtained.

In addition, the place where ionization occurs can be specified to the hetero junction so that low excessive-noise properties can be obtained. Furthermore, assistance by high electric field is not required which enables low voltage drive.

The conventional super lattice APD using an amorphous Si-base semiconductor, which has been described above, has a problem in large dark current. Embodiments of the cause for the dark current include carriers injected from an electrode and carriers thermally generated through a defective level inside the detector or interfacial level at the hetero junction. The generation of the carriers essentially depends on the bandgap and the larger the bandgap is, the less the carriers thermally generated are. The amorphous Si-base semiconductor super-lattice APD has not a bandgap sufficient for suppressing the dark current.

According to the structure of the above semiconductor photo detector, on the other hand, the carrier multiplication layer 106 is formed of a non-single crystalline $Zn_xCd_{1-x}S$ super lattice, so that the bandgap Eg of the carrier multiplication layer 106 can be increased to 2.53–3.54 eV, and therefore thermally generated carrier can be decreased. As a result, the dark current can be suppressed.

In addition, the bandgap Eg of the carrier multiplication layer 106 is increased to 2.53–3.54 eV, whereby the carrier multiplication layer 106 has not sensitivity to the visible light and optical absorption of visible light does not occur in the carrier multiplication layer 106. Accordingly, the optical absorption of the visible light is conducted exclusively in the optical absorption layer 104 so that a high SN ratio can be obtained without fluctuations in the multiplication factor in the carrier multiplication layer 106 depending on the wavelength of the incident light.

In the above-described semiconductor photo detector, a non-single crystalline $Zn_xCd_{1-x}S$ super lattice is used as the carrier multiplication layer 106. It is also possible to increase the band discontinuity $\Delta Ec$ of the carrier multiplication layer 106 at the hetero junction to 0.86 eV by using as the carrier multiplication layer 106 a super lattice which is formed of a multilayer film obtained by stacking plural layers of a non-single crystalline $Zn_xCd_{1-x}Se$ layer and has an energy band showing a periodic change by successively changing the composition ratio of $Zn_xCd_{1-x}Se$ ($0 \leq x \leq 1$) upon film deposition of each $Zn_xCd_{1-x}Se$ layer.

It is also possible to increase the band discontinuity $\Delta Ec$ of the carrier multiplication layer 106 at the hetero junction as large as 0.75 eV by using as the carrier multiplication layer 106 a super lattice which is composed of a multilayer obtained by stacking plural layers of a non-single crystalline $Zn_xCd_{1-x}Te$ layer and has an energy band showing a periodical change by successively changing the composition ratio of $Zn_xCd_{1-x}Te$ ($0 \leq x \leq 1$) upon film deposition of each $Zn_xCd_{1-x}Te$ layer.

Accordingly in the semiconductor photo detector using as a carrier multiplication layer a non-single crystalline $Zn_xCd_{1-x}Se$ super lattice or non-single crystalline $Zn_xCd_{1-x}Te$ super lattice, the band discontinuity $\Delta Ec$ can be increased to 0.86 eV or 0.75 eV. Thus, large ionization energy can be obtained at the hetero junction, which brings about a large multiplication effect and as a result, a highly-sensitive property can be obtained. In addition, the place where ionization occurs can be specified to the hetero junction so that a low excess-noise property can be obtained. Furthermore, without an assistance by a high electric field, low voltage drive can be conducted.

Figure 11A:
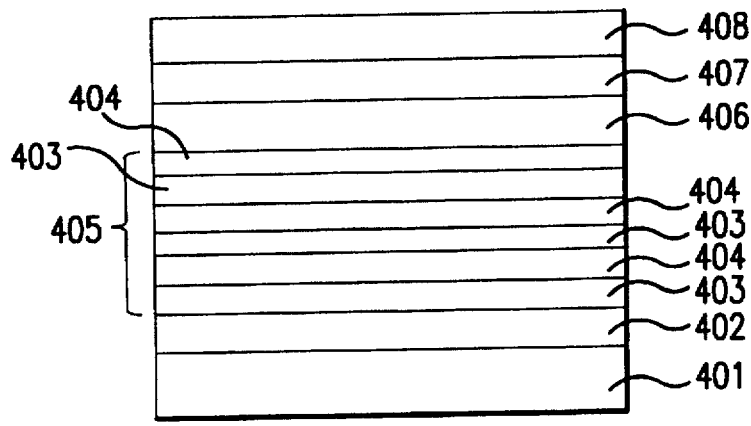
FIG. 11(a) is a schematic cross-sectional view illustrating the structure of the conventional amorphous Si-base graded super-lattice APD, (b) is an energy band diagram illustrating the band structure of this APD at the time when no voltage is applied, and (c) is an energy band diagram illustrating the band structure of this APD at the time when reverse bias is applied.
Figure 11B:
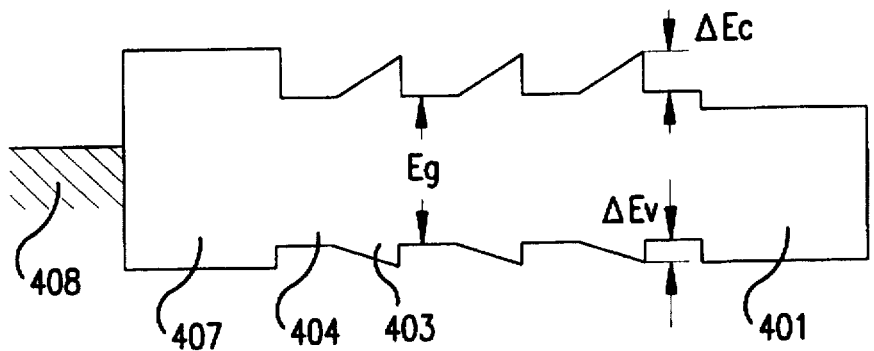
Figure 11C:
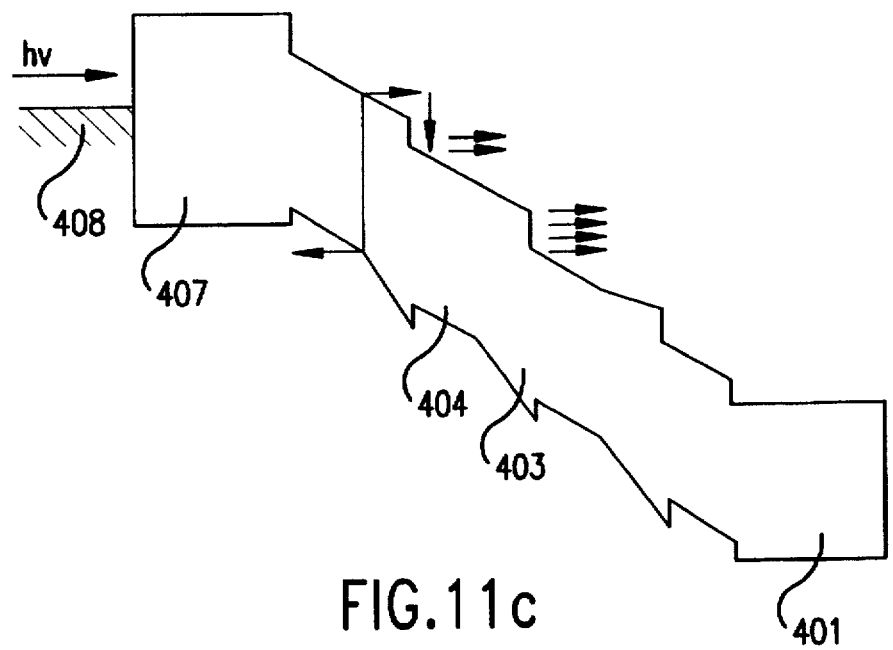

In the respective case where non-single crystalline $Zn_xCd_{1-x}S$ super lattice, non-single crystalline $Zn_xCd_{1-x}Se$ super lattice, and non-single crystalline $Zn_xCd_{1-x}Te$ super lattice are used as the carrier multiplication layer 106 of the semiconductor photo detector, comparisons with the APD having a super-lattice structure using an amorphous Si-base semiconductor shown in FIG. 11 in the band discontinuity $\Delta Ec$ at the hetero junction of the carrier multiplication layer and the bandgap Eg of the carrier multiplication layer are shown in Table 1.

When, in the non-single crystalline $Zn_xCd_{1-x}Se$ super lattice, x is changed successively within $0 \leq x \leq 1$, the bandgap Eg of the carrier multiplication layer becomes 1.70 (CdSe film) to 2.67 (ZnSe film). When, in the non-single crystalline $Zn_xCd_{1-x}Te$ super lattice, x is changed successively within 0≦x≦1, the bandgap Eg of the carrier multiplication layer becomes 1.53 (CdTe film)–2.25 (ZnTe film).

TABLE 1

|  | S | Se | Te | Conventional embodiment |
|---|---|---|---|---|
| ΔEc | 0.89 | 0.86 | 0.75 | 0.34 |
| Eg | 2.53–3.54 | 1.70–2.67 | 1.53–2.25 | 1.70 |

It is also possible to, at the junction of the optical absorption layer 104 and the carrier multiplication layer 106, position the energy band of the conduction band of the carrier multiplication layer 106 below the optical absorption layer 104 by forming the carrier multiplication layer 106 from non-single crystalline $Zn_xCd_{1-x}S$ super lattice, non-single crystalline $Zn_xCd_{1-x}Se$ super lattice or non-single crystalline $Zn_xCd_{1-x}Te$ super lattice when the optical absorption layer 104 is formed of an a—Si film highly sensitive to the visible light. Described specifically, the band offsets to the optical absorption layer 104 when it is formed of a—Si are 0.74 eV in the case where the carrier multiplication layer is formed of ZnCdS, 0.90 eV in the case of ZnCdSe, and 0.23 eV in the case of ZnCdTe.

There exists no energy barrier against electrons at the junction between the optical absorption layer 104 and the carrier multiplication layer 106, so that cooling or accumulation of electrons at this part can be avoided and sensitivity increase and noise reduction can be attained.

Incidentally, the formation embodiment of the super lattice using non-single crystalline $Zn_xCd_{1-x}M$ (M =S, Se, Te) for the formation of the carrier multiplication layer 106 was described above. It is not necessary to form a super-lattice structure having a periodically-changing energy band. Alternatively, it is possible to form a multilayer film having layers different in a composition ratio so that the multilayer film has a band discontinuity ΔEc enough for the generation of avalanche multiplication.

(Embodiments)

A description will next be made of the specific embodiments of the semiconductor photo detector according to the present invention.

Embodiment 1

Figure 2A:
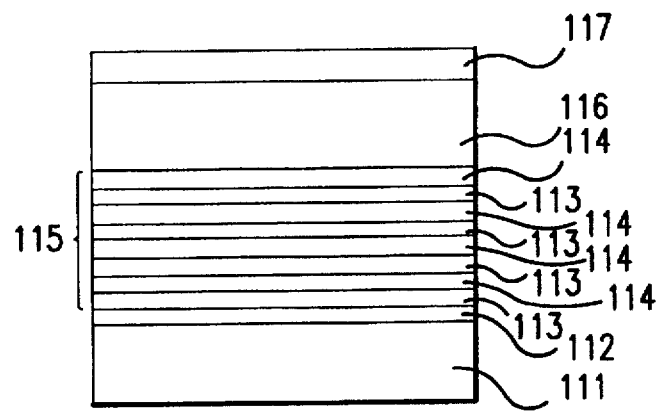
FIG. 2(a) is a schematic cross-sectional view illustrating the structure of the semiconductor photo detector according to the first embodiment of the present invention, (b) is an energy band diagram illustrating the band structure of the semiconductor photo detector at the time when no voltage is applied, and (c) is an energy band diagram illustrating the band structure of the semiconductor photo detector at the time when reverse bias is applied.
Figure 2B:
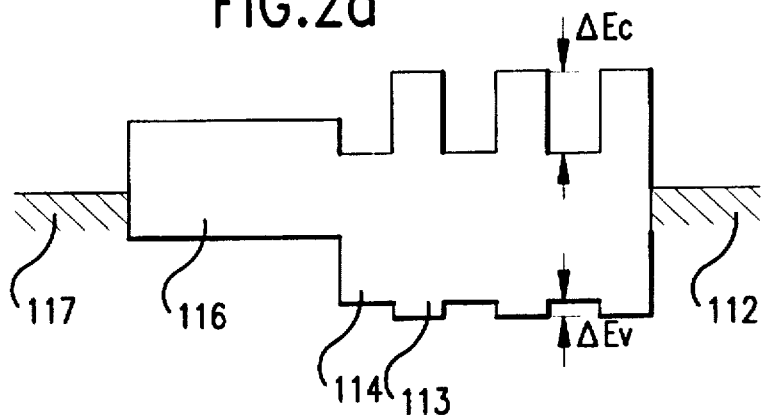
Figure 2C:
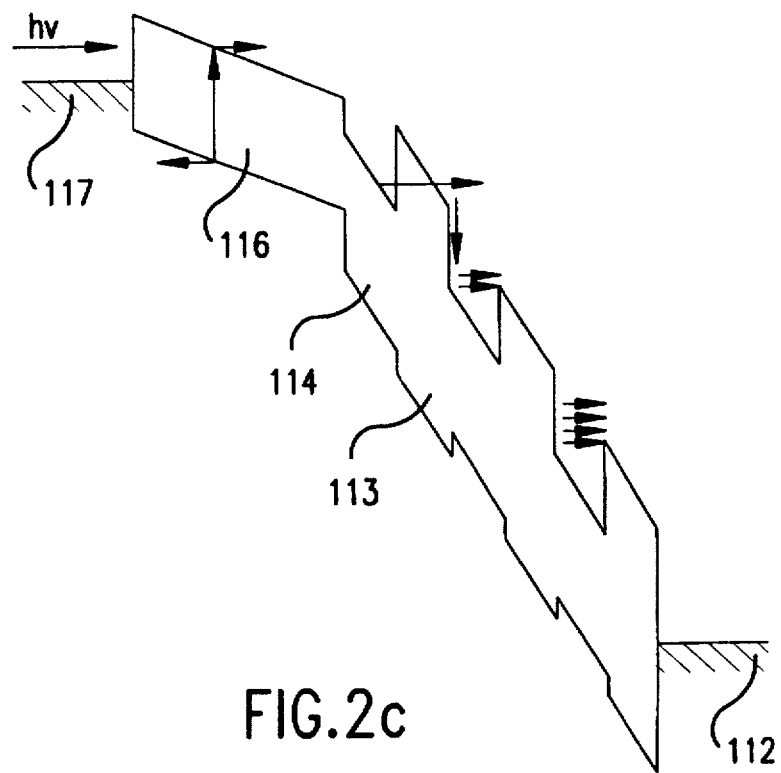

FIG. 2 illustrates semiconductor photo detectors according to the first embodiment, in which (a) is a cross-sectional view, (b) is a schematic diagram illustrating the band structure when no voltage is applied, and (c) is a schematic diagram illustrating the band structure at the time when reverse bias is applied.

This semiconductor photo detector is formed of an electrode 112 made of chromium (Cr), a carrier multiplication layer 115 which is formed of a super lattice layer, an optical absorption layer 116 made of an i-type a—Si:H and a transparent electrode 117 made of ITO, all of them being stacked one after another on a glass substrate 111. The carrier multiplication layer 115 is obtained by stacking a barrier layer 113 made of ZnS and a well layer 114 made of CdS alternately with the same film thickness, thereby forming a super lattice layer having a periodic band structure.

The above-described semiconductor photo detector is fabricated in the following manner.

On the glass substrate 111, the Cr electrode 112 is formed by the sputtering method. Then, the barrier layer 113 made of polycrystalline ZnS is formed to give the film thickness of 1–100 nm and the well layer 114 made of polycrystalline CdS is formed to give the film thickness of 1–100 nm alternately and successively by the co-sputtering method using ZnS and CdS as targets, whereby a super lattice layer composed of 3–100 layers is formed as the carrier multiplication layer 115.

Then, i-type a—Si:H is deposited to give a film thickness of 1.1 μm by the plasma CVD method using $SiH_4$ as a material gas, whereby the optical absorption layer 116 is formed.

As a final step, ITO is deposited to a film thickness of 60 nm by the sputtering method, whereby the transparent electrode 117 is formed.

Examples of the material for the electrode 112 usable in the present invention include Ta, Ti, Mo, Al and ITO, while those for the transparent electrode 117 include $SnO_2$ and semi-transparent metals such as Au, Cr and Pd.

As the optical absorption layer 116, non-single crystalline materials having a sensitivity to the visible light can be used. Examples include non-single crystalline materials composed of a compound formed of at least one material selected from Ge, C, N, O or H and Si, such as poly—Si, μc—Si, a—SiC:H and a—SiGe:H. Films available from these materials can also be used after lamination. The non-single crystalline materials are used for avoiding the problem of lattice constant mismatching.

As the material forming the barrier layer 113 or well layer 114, that represented by the formula: $Zn_xCd_{1-x}S$ (x=0–1) can be used. X is any value within 0 to 1 by which the band discontinuity of the conduction band of the barrier layer 113 and well layer 114 becomes larger and the band discontinuity of the valence band becomes smaller.

According to the structure of the above-described semiconductor photo detector, the band structures at the time when no voltage is applied and when reverse bias is applied are as shown in FIG. 2(b) and (c), respectively.

Concerning the bandgap Eg of the carrier multiplication layer 115, that of the well layer 114 made of CdS is 2.53 eV and that of the barrier layer 113 made of ZnS is 3.54 eV. The bandgap is large so that thermally produced carriers can be suppressed and dark current can be lowered. In addition, the carrier multiplication layer 115 hardly absorbs visible light at the wavelength of 400–700 nm so that photo carriers are not produced and neither fluctuations of the multiplication factor depending on the wavelength of the incident light nor lowering in the SN ratio occur.

The band discontinuity ΔEc at the hetero junction of the carrier multiplication layer 115 on the side of the conduction band is 0.89 eV and that on the side of the valence band ΔEv is 0.12 eV. ΔEc is large and ΔEv is small so that avalanche multiplication of electrons occur but that of holes do not occur, whereby a high SN ratio can be obtained.

Furthermore, because ΔEc is large, the ionization can be caused without failure at the hetero junction, in other words, the place where ionization occur can be specified, which makes it possible to suppress the fluctuations in the multiplication factor and to attain low noise properties.

The carrier multiplication layer 115 is formed of a non-single crystalline $Zn_xCd_{1-x}S$ super lattice, which makes it possible to adjust the band offset of the conduction band of the carrier multiplication layer 115 (well layer 114) to 0.74 eV to the optical absorption layer 116 formed of a non-single crystalline material having sensitivity to visible light. The conduction band of the carrier multiplication layer 115 is positioned lower than the one of the optical absorption layer 116 at the junction between the optical absorption layer 116 and the carrier multiplication layer 115, so that no energy barrier exists against electrons. It is therefore possible to prevent cooling or accumulation of electrons at this place and attain sensitivity increase and noise reduction.

This embodiment shows a structure in which the glass substrate ill, electrode 112, carrier multiplication layer 115, optical absorption layer 116 and transparent electrode 117 have been stacked in this order. The present invention is not limited to this embodiment. Usable examples include the structure in which a substrate, electrode, optical absorption layer, carrier multiplication layer and transparent electrode have been stacked in this order, the structure in which a light transmitting substrate, transparent electrode, optical absorption layer, carrier multiplication layer and electrode have been stacked in this order using the light transmitting substrate as a substrate, and the structure in which a light transmitting substrate, transparent electrode, carrier multiplication layer, optical absorption layer and electrode have been stacked in this order. Similar effects are available in such structures.

Embodiment 2

Figure 3A:
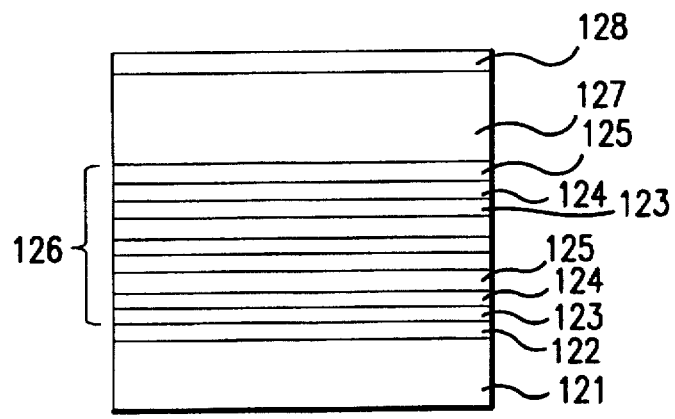
FIG. 3(a) is a schematic cross-sectional view illustrating the structure of the semiconductor photo detector according to the second embodiment of the present invention, (b) is an energy band diagram illustrating the band structure of the semiconductor photo detector at the time when no voltage is applied, and (c) is an energy band diagram illustrating the band structure of the semiconductor photo detector at the time when reverse bias is applied.
Figure 3B:
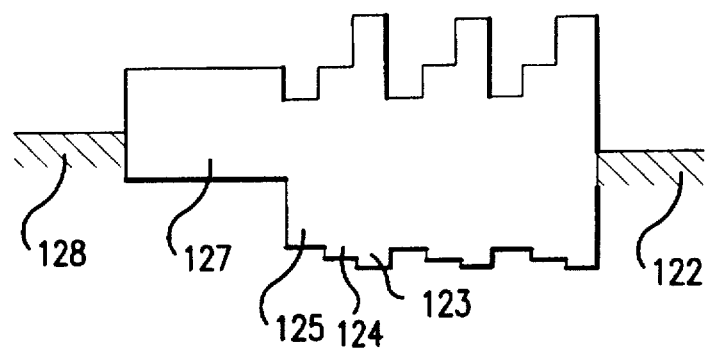
Figure 3C:
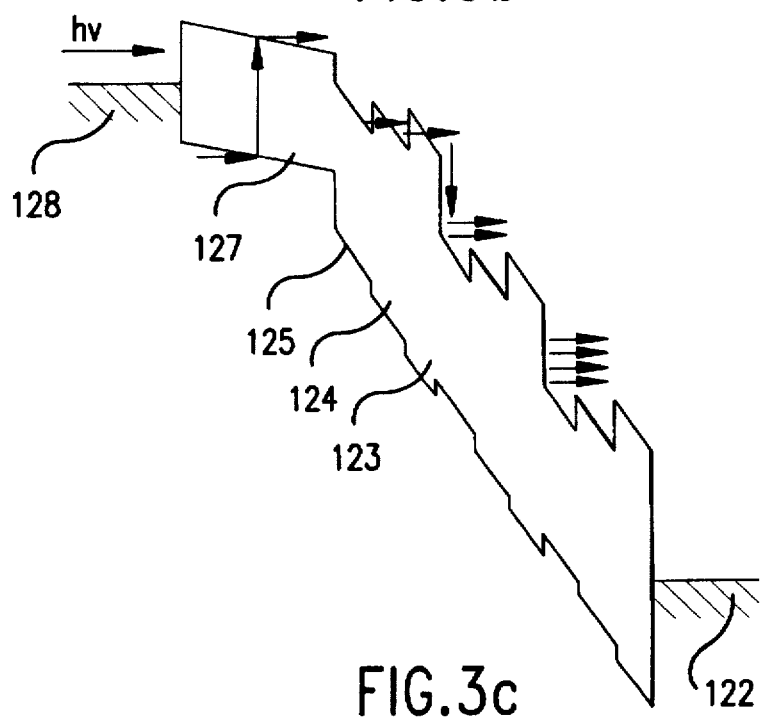

FIG. 3 illustrates a semiconductor photo detector according to the second embodiment of the invention, in which (a) is its cross-sectional view, (b) is a schematic diagram illustrating the band structure at the time when no voltage is applied, and (c) is a schematic diagram illustrating the band structure at the time when reverse bias is applied.

The semiconductor photo detector has a structure in which an electrode 122 made of chromium (Cr), a carrier multiplication layer 126 made of a super lattice layer, an optical absorption layer 127 made of an i-type a—Si:H and a transparent electrode made of ITO have been stacked on a glass substrate 121. The carrier multiplication layer 126 forms a super lattice layer having a periodic band structure by stacking plural layers each obtained by stacking a ZnS layer 123, $Zn_{0.5}Cd_{0.5}S$ layer 124 and CdS layer 125.

The above-described semiconductor photo detector is fabricated as follows:

First, the Cr electrode 122 is formed on the glass substrate 121 by the sputtering method. Then, the polycrystalline ZnS layer 123, polycrystalline $Zn_{0.5}Cd_{0.5}S$ layer 124 and polycrystalline CdS layer 125 are formed successively to give each film thickness of 1–100 nm by the co-sputtering method using ZnS and CdS as targets, whereby a super lattice layer comprising 3– 100 layers is formed as the carrier multiplication layer 126.

Then, the optical absorption layer 127 is formed by depositing i-type a—Si:H to give a film thickness of 1.1 μm by the plasma CVD method using $SiH_4$ as a material gas.

As the final step, ITO is deposited to give a film thickness of 60 nm by the sputtering method, whereby the transparent electrode 128 is formed.

According to the above-described structure of the semiconductor photo detector, concerning the band structure at the time when no voltage is applied and at the time when reverse bias is applied, the carrier multiplication layer 126 is allowed to have a conduction band imparted with a stepwise potential structure as illustrated in FIGS. 3(b) and (c), respectively.

In the super lattice structure as described in Embodiment 1 (FIG. 2), it is necessary that in order to pass from the well layer 114 to the barrier layer 113, electrons have kinetic energy greater than the energy barrier at the hetero junction. This kinetic energy is given from the external electric field. Electrons traveling in the semiconductor, accelerated by the electric field are scattered as a result of collision with thermally oscillating lattice atoms, whereby kinetic energy of electrons is given to the lattice as lattice oscillation and electrons lose the kinetic energy. The higher the electric field strength is, the more frequently the accelerated atoms collide with the lattice atoms. So, even if the electric field strength is heightened, the kinetic energy is suppressed by the scattering caused by the collision with the lattice atoms and the average kinetic energy of electrons is saturated and becomes fixed.

In Embodiment 2 (FIG. 3), the conduction band in the carrier multiplication layer 126 is formed to have a stepwise potential structure to make the energy barrier of electrons in each step smaller than the average kinetic energy of electrons available by the external electric field as described above, which makes it possible for most of the electrons to pass through the energy barrier at the hetero junction. Compared with the Embodiment 1, the avalanche multiplication can be caused more effectively by electrons.

Embodiment 3

Figure 4A:
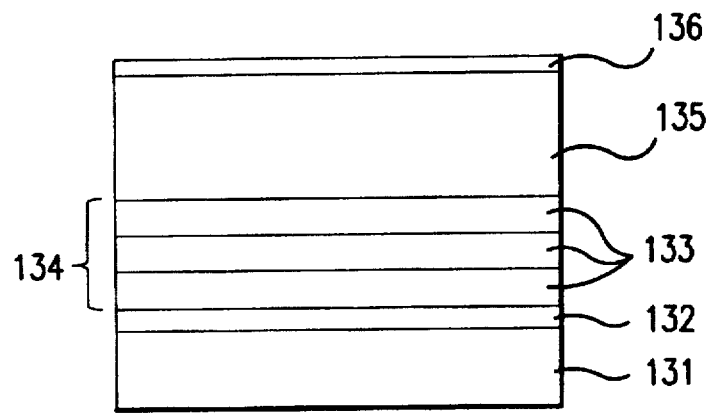
FIG. 4(a) is a schematic cross-sectional view illustrating the structure of the semiconductor photo detector according to the third embodiment of the present invention, (b) is an energy band diagram illustrating the band structure of the semiconductor photo detector at the time when no voltage is applied, and (c) is an energy band diagram illustrating the band structure of the semiconductor photo detector at the time when reverse bias is applied.
Figure 4B:
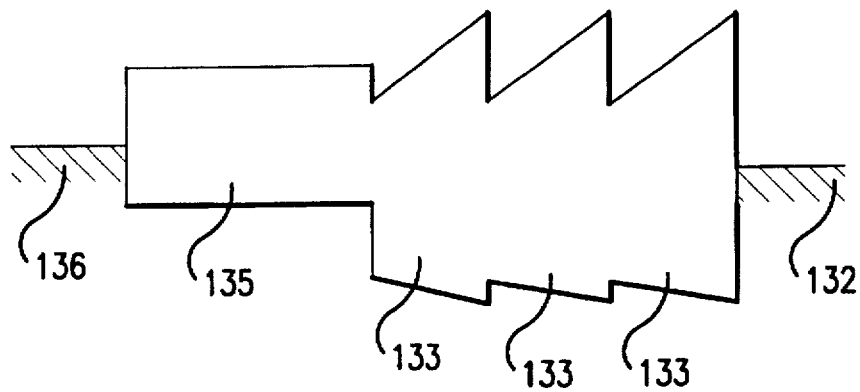
Figure 4C:
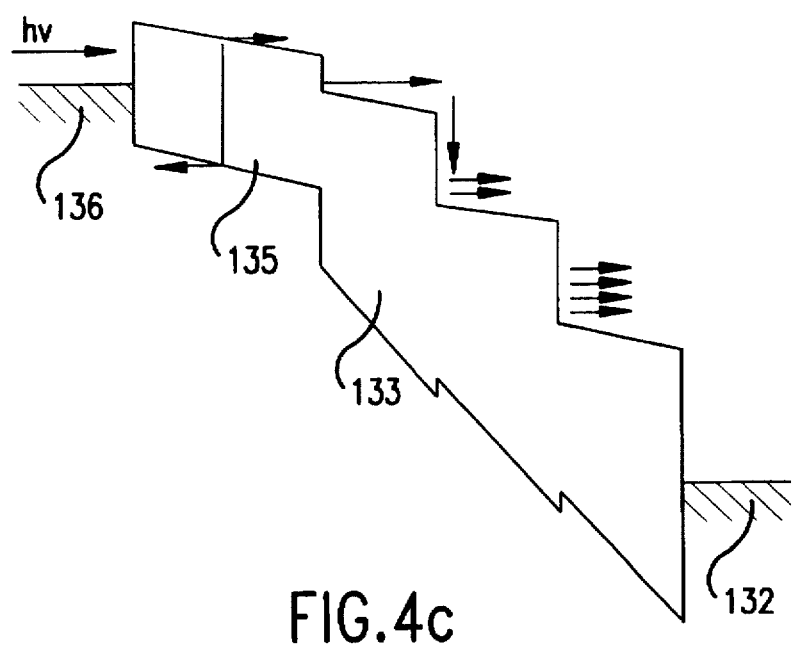

FIG. 4 illustrates a semiconductor photo detector according to the third embodiment of the present invention, in which (a) is its cross-sectional view, (b) is a schematic diagram illustrating a band structure at the time when no voltage is applied and (c) is a schematic diagram illustrating the band structure at the time when reverse bias is applied.

The semiconductor photo detector in this embodiment comprises an electrode 132 made of chromium (Cr), a carrier multiplication layer 134 which is a super lattice layer, an optical absorption layer 135 made of i-type a—Si:H and a transparent electrode 136 made of ITO, all of them being stacked on a glass substrate 131. The carrier multiplication layer 134 forms a super lattice layer having a periodic band structure obtained by stacking plural layers each being a $Zn_xCd_{1-x}S$ layer 133 in which the value of x is successively changed within a range of from 0 to 1.

The above-described semiconductor photo detector is fabricated as follows:

First, the Cr electrode 132 is formed on the glass substrate 131 by the sputtering method. Then, the amorphous $Zn_xCd_{1-x}S$ layer 133 having a composition varied successively within a range of from x=1 (ZnS) to x=0 (CdS) is formed to give a film thickness of 10–100 nm by controlling the deposition rate of ZnS or CdS in accordance with the multi-source EB vapor deposition method using ZnS, CdS and S as vapor sources. Such film formation is repeated, thereby forming a super lattice layer comprising 3–100 layers, whereby the carrier multiplication layer 134 is formed.

Then, the optical absorption layer 135 is formed by depositing i-type a—Si:H to give a film thickness of 1.1 μm by the plasma CVD method using $SiH_4$ as a material gas.

As the final step, ITO is deposited to give a film thickness of 60 nm by the sputtering method, whereby the transparent electrode 136 is formed.

According to the above-described structure of the semiconductor photo detector, concerning band structures at the time when no voltage is applied and at the time when reverse bias is applied, the conduction band in the carrier multiplication layer 134 is allowed to have a saw-tooth potential structure as illustrated in FIGS. 4(b) and (c), respectively. As a result, it is possible to remove the energy barrier in the traveling direction of electrons at the hetero junction, which makes it possible to cause avalanche multiplication by electrons more effectively compared with Embodiment 2 (FIG. 3).

Embodiment 4

Figure 5:
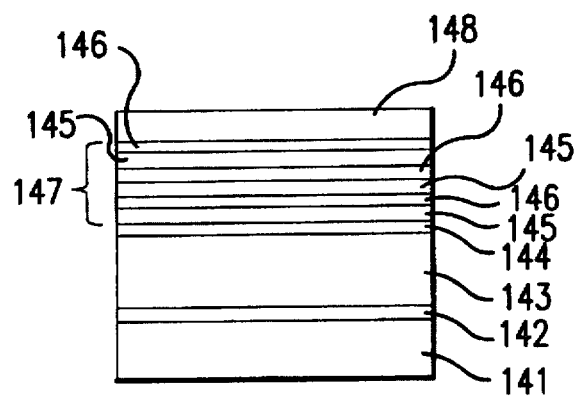
FIG. 5 is a schematic cross-sectional view illustrating the structure of a semiconductor photo detector according to the fourth embodiment.

FIG. 5 is a cross-sectional view of a semiconductor photo detector according to the fourth embodiment of the invention. This semiconductor photo detector comprises a transparent electrode 142 made of ITO, an optical absorption layer 143 made of i-type a—Si:H, a buffer layer 144 made of a—SiN$_x$:H, a carrier multiplication layer 147 which is a super lattice layer and an electrode 148 made of Al, all of them being stacked on a glass substrate 141. The carrier multiplication layer 147 is composed of plural layers each obtained by stacking alternately a well layer 145 made of CdS and a barrier layer 146 made of ZnS.

The above-described semiconductor photo detector is fabricated as follows:

First, ITO is deposited on the glass substrate 141 to give a film thickness of 60 nm by the sputtering method, whereby the transparent electrode 142 is formed.

Then, i-type a—Si:H is deposited to give a film thickness of 1.1 μm by the plasma CVD method using SiH$_4$ as a material gas, whereby the optical absorption layer 143 is formed.

Then, a—Si:N$_x$ is deposited to give a film thickness of 50 nm by the plasma CVD method using SiH$_4$ and NH$_3$ as material gases, whereby the buffer layer 144 is formed.

The barrier layer 146 composed of polycrystalline ZnS and the well layer 145 made of polycrystalline CdS are formed successively to give each film thickness of 1–100 nm by the co-sputtering method using ZnS and CdS as targets, whereby a super lattice layer is formed. From 3–100 super lattice layers, the carrier multiplication layer 147 is formed.

As the final step, the electrode 148 is formed by depositing Al to give a film thickness of 500 nm by the sputtering method.

According to the structure of the above-described photo detector, the existence of the buffer layer 144 reduces the interfacial level at the hetero junction between the optical absorption layer 143 and the carrier multiplication layer 147 and makes it possible to inject the photo carriers generated by the optical absorption layer 143 to the carrier multiplication layer 147 effectively, whereby sensitivity is improved.

In addition, generation of thermal carriers attributed to the interfacial level decreases, whereby the dark current can be suppressed. Furthermore, mutual diffusion on the interface between the optical absorption layer 143 and the carrier multiplication layer 147 can be controlled and deterioration with the passage of time can be suppressed, whereby reliability is improved.

As the material constituting the buffer layer 144, it is desired to employ a material which has a small interfacial level between the non-single crystalline Si-base semiconductor which is the optical absorption layer 143 and non-single crystalline Zn$_x$Cd$_{1-x}$S which is the carrier multiplication layer 147 and has a low diffusion coefficient. Embodiments include non-single crystalline materials composed of a compound of at least one material selected from C, N, O or H and Si, for embodiment, a—SiN$_x$:H, a—SiO$_x$:H, a—SiON$_x$:H and ZnO.

When the thickness of the buffer layer 144 is thin, the above-described effects cannot be obtained fully. When it is thick, on the other hand, photo carriers are accumulated on the interface between the optical absorption layer 143 and the buffer layer 144 and are not injected to the carrier multiplication layer 147. Inappropriate thickness thus causes such problems. The film thickness of the buffer layer 144 is preferably 5–100 nm. To bring about sufficient effects, the buffer layer is desired to have a film thickness of 10–50 nm.

Embodiment 5

Figure 6A:
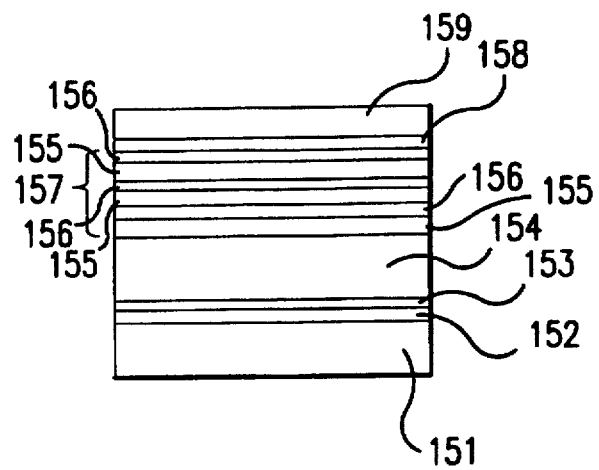
FIG. 6(a) is a schematic cross-sectional view illustrating the structure of the semiconductor photo detector according to the fifth embodiment of the present invention, and (b) is an energy band diagram illustrating the band structure of the semiconductor photo detector at the time when reverse bias is applied.

FIG. 6 illustrates a semiconductor photo detector according to the fifth embodiment of the invention, in which (a) is its cross-sectional view and (b) is a schematic diagram illustrating the band structure at the time when reverse bias is applied.

The above-described semiconductor photo detector comprises a transparent electrode 152 composed of ITO, a blocking layer 153 made of p-type a—SiC:H, an optical absorption layer 154 made of i-type a—Si:H, a carrier multiplication layer 157 made of a super lattice layer, a blocking layer 158 made of n-type a—Si:H and an electrode 159 made of Al, said layers being stacked on a glass substrate 151. The carrier multiplication layer 157 forms a super lattice layer having a periodic band structure. It is obtained by stacking plural layers, each layer being obtained by alternately stacking a well layer 155 made of CdS and a barrier layer 156 made of ZnS.

The above-described photo detector is fabricated as follows:

First, ITO is deposited on the glass substrate 151 to give a film thickness of 100 nm by the sputtering method, whereby the transparent electrode 152 is formed.

Next, p-type a—SiC:H is deposited to give a film thickness of 50 nm by the plasma CVD method using SiH$_4$, CH$_4$ and B$_2$H$_6$ as material gases, whereby the blocking layer 153 is formed.

Then, the optical absorption layer 154 made of i-type a—Si:H is formed to a film thickness of 1.5 μm by the plasma CVD method using SiH$_4$ as a material gas.

The barrier layer 156 composed of polycrystalline ZnS and the well layer 155 made of polycrystalline CdS are formed successively to give each film thickness of 1–100 nm by the co-sputtering method using ZnS and CdS as targets, whereby a super lattice layer is formed. From 3–100 super lattice layers, the carrier multiplication layer 157 is formed.

The blocking layer 158 is then formed to a film thickness of 50 nm by depositing n-type a—Si:H by the plasma CVD method using SiH$_4$ and PH$_3$ as material gases.

As the final step, the electrode 159 is formed by depositing Al to a film thickness of 500 nm by the sputtering method.

Figure 6B:
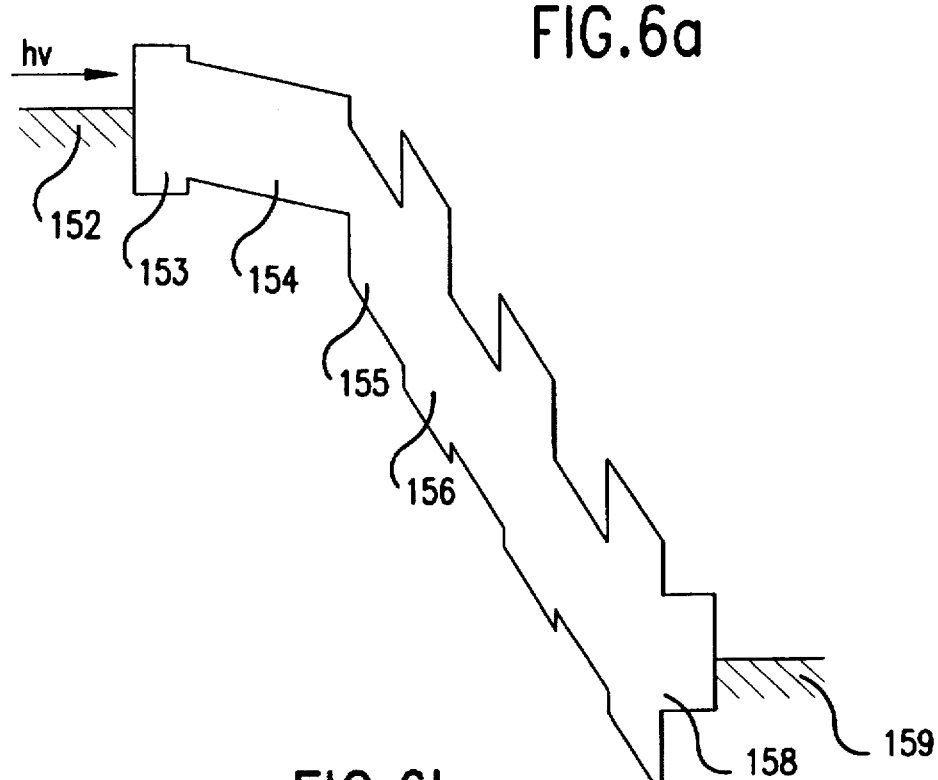

According to the structure of the above-described semiconductor photo detector, the band structure at the time when reverse bias is applied is as illustrated in FIG. 6(b). Existence of the blocking layer 153 inhibits the injection of electrons from the transparent electrode 152 to the optical absorption layer 154 and the existence of the blocking layer 158 inhibits the injection of holes from the electrode 159 to the carrier multiplication layer 157, whereby the dark current can be reduced and a high SN ratio can be obtained. Even if both of the blocking layers are not formed, injection of electrons or holes can be inhibited, so that effects can be brought about for the reduction in the dark current and high SN ratio. It is however preferred to form both the blocking layer 153 against electron injection and the blocking layer 158 against hole injection to actualize further reduction in the dark current and higher SN ratio.

Embodiments of the material usable for the formation of the blocking layer 153 include, in addition to p-type a—SiC:H, non-single crystalline materials showing p-type conductivity such as p-type a—Si:H. To allow the optical absorption layer 154 to absorb light efficiently, it is preferred to use materials having a bandgap larger than that of the optical absorption layer 154.

Examples of the material usable for the formation of the blocking layer 158 include, in addition to n-type a—Si:H, non-single crystalline materials showing n-type conductivity such as n-type a—SiC:H and n-type a—SiGe:H, and non-single crystalline $CeO_2$.

Embodiment 6

Figure 7A:
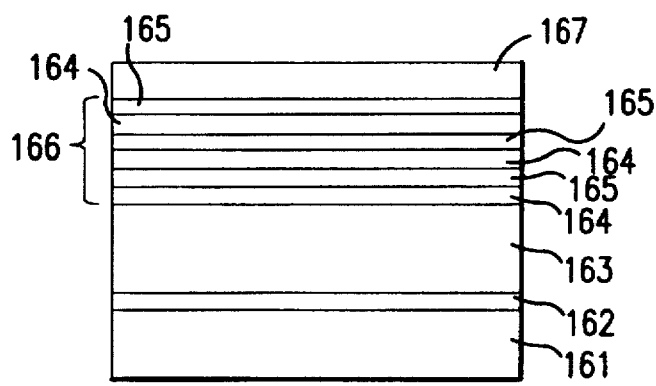
FIG. 7(a) is a schematic cross-sectional view illustrating the structure of the semiconductor photo detector according to the sixth embodiment of the present invention, and (b) is an energy band diagram illustrating the band structure at the time when no voltage is applied.

FIG. 7 illustrates a semiconductor photo detector according to the sixth embodiment of the present invention, in which (a) is its cross-sectional view and (b) is a schematic diagram illustrating the band structure at the time when no voltage is applied.

This semiconductor photo detector comprises a transparent electrode 162 made of ITO, an optical absorption layer 163 made of i-type a—Si:H, a carrier, multiplication layer 166 formed of a super-lattice layer and an electrode 167 made of Al, all of them being stacked on a glass substrate 161. The carrier multiplication layer 166 forms a super lattice layer having a periodic band structure. It is obtained by stacking plural layers, each layer being obtained by alternately stacking a well layer 164 made of CdSe and a barrier layer 165 made of ZnSe.

The above-described photo detector is fabricated as follows:

First, ITO is deposited on the glass substrate 161 to give a film thickness of 60 nm by the sputtering method, whereby the transparent electrode 162 is formed.

Next, i-type a—Si:H is deposited to give a film thickness of 1.1 μm by the plasma CVD method using $SiH_4$ as a material gas, whereby the optical absorption layer 163 is formed.

The barrier layer 165 composed of polycrystalline ZnSe and the well layer 164 made of polycrystalline CdSe are formed successively to give each film thickness of 1–100 nm by the co-sputtering method using ZnSe and CdSe as targets, whereby a super lattice layer is formed. From 3–100 super lattice layers, the carrier multiplication layer 166 is formed.

As the final step, the electrode 167 is formed by depositing Al to a film thickness of 500 nm by the sputtering method.

Figure 7B:
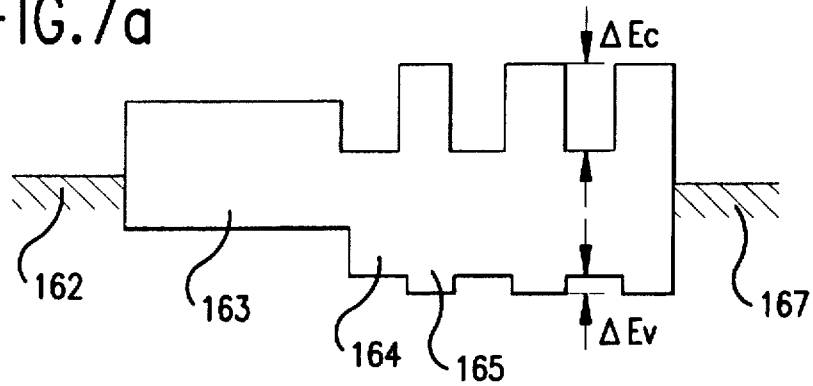

According to the structure of the above-described semiconductor photo detector, the band structure at the time when no voltage is applied is as illustrated in FIG. 7(b). Described specifically, the band discontinuity ΔEc at the hetero junction is 0.86 eV on the side of the conduction band. The ratio of energy which electrons receive at the hetero junction is larger compared with the above-described semiconductor photo detector according to Embodiment 1 (FIG. 2). As a result, it is possible to actualize a large multiplication effect and sensitivity increase.

The band discontinuity ΔEv on the side of the valence band is as small as 0.07 eV so that avalanche multiplication of holes does not occur and a SN ratio as high as that in the case of the semiconductor photo detector according to Embodiment 1 can be obtained.

In the semiconductor photo detector according to this embodiment, the bandgap (Eg) of CdSe forming the carrier multiplication layer 166 is 1.74 eV, which is substantially equal to the bandgap (Eg=1.70 ev) of i-type a—Si:H forming the optical absorption layer 163. In the case of the incident light from the side of the carrier multiplication layer 166, optical absorption of the visible light occurs even in the carrier multiplication layer 166, which generates photo carriers. It is therefore desired that the photo detector has a structure in which the electrode 167, the carrier multiplication 166, the optical absorption layer 163 and the transparent electrode 162 have been stacked in this order and incident light are irradiated from the side of the optical absorption layer 163.

Incidentally, described in this embodiment is the carrier multiplication layer 166 having a simple super-lattice structure as a band structure. It is also possible to employ a stepwise potential structure as described in Embodiment 2 (FIG. 3) or a saw-tooth potential structure as described in Embodiment 3 (FIG. 4) by changing the composition ratio of amorphous $Zn_xCd_{1-x}Se$. In such a case, similar effects to those described in Embodiment 2 or 3 can be obtained.

It is also possible to employ a buffer layer as described in Embodiment 4 (FIG. 5) or a blocking layer as described in Embodiment 5 (FIG. 6). In this case, similar effects to those described in Embodiment 4 or 5 are available.

Embodiment 7

Figure 8A:
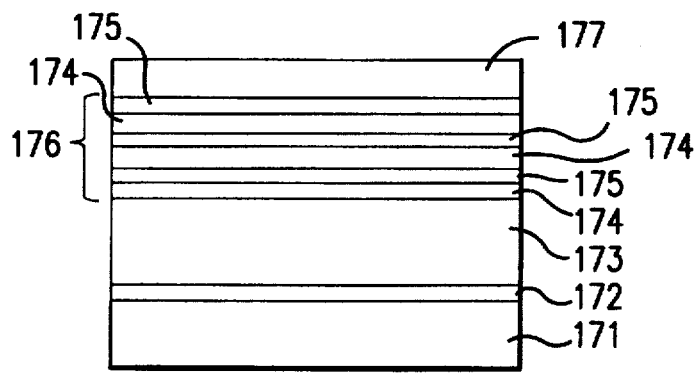
FIG. 8(a) is a schematic cross-sectional view illustrating the structure of the semiconductor photo detector according to the seventh embodiment of the present invention, and (b) is an energy band diagram illustrating the band structure at the time when no voltage is applied.

FIG. 8 illustrates a semiconductor photo detector according to the seventh embodiment of the present invention, in which (a) is its cross-sectional view and (b) is a schematic diagram illustrating the band structure at the time when no voltage is applied.

This semiconductor photo detector comprises ITO electrode 172, an i-type a—Si:H optical absorption layer 173, a carrier multiplication layer 176 formed of a super-lattice layer and an electrode 177 made of Al, all of them being stacked one after another on a glass substrate 171. The carrier multiplication layer 176 forms a super lattice layer having a periodic band structure. It is obtained by stacking plural layers, each layer being obtained by alternately stacking a well layer 174 made of CdTe and a barrier layer 175 made of ZnTe. The structure according to this embodiment is similar to Embodiment 6 except for the materials used for the well layer 174 and the barrier layer 175.

Figure 8B:
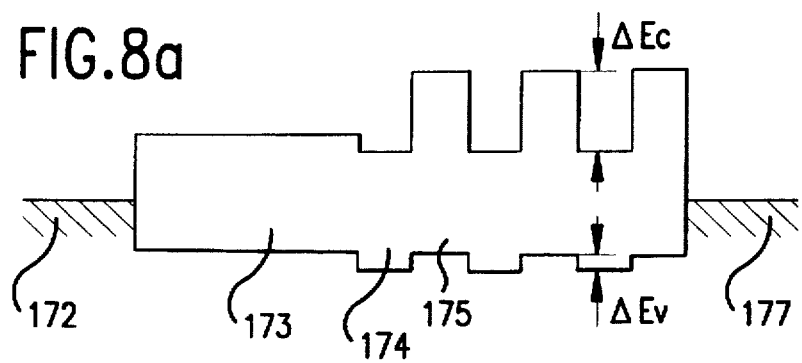
Figure 9A:
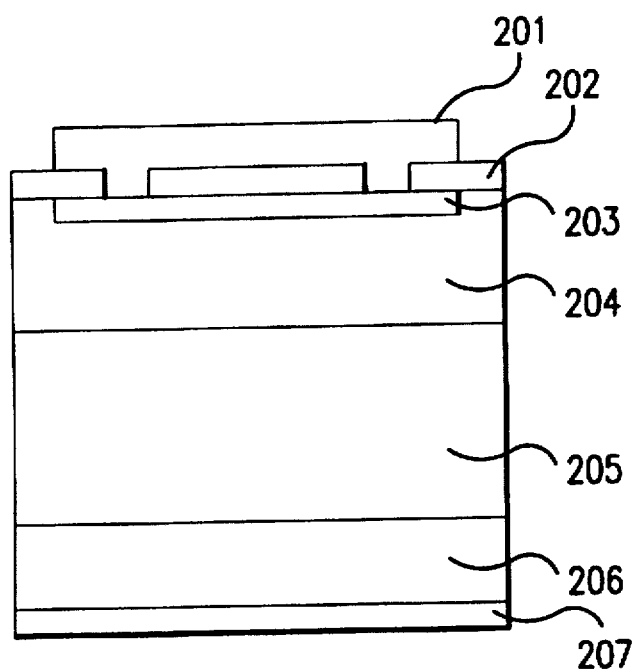
FIG. 9(a) is a cross-sectional schematic view illustrating the structure of the conventional single crystalline Si APD, and (b) is an energy band diagram illustrating the band structure of this APD at the time when reverse bias is applied.
Figure 9B:
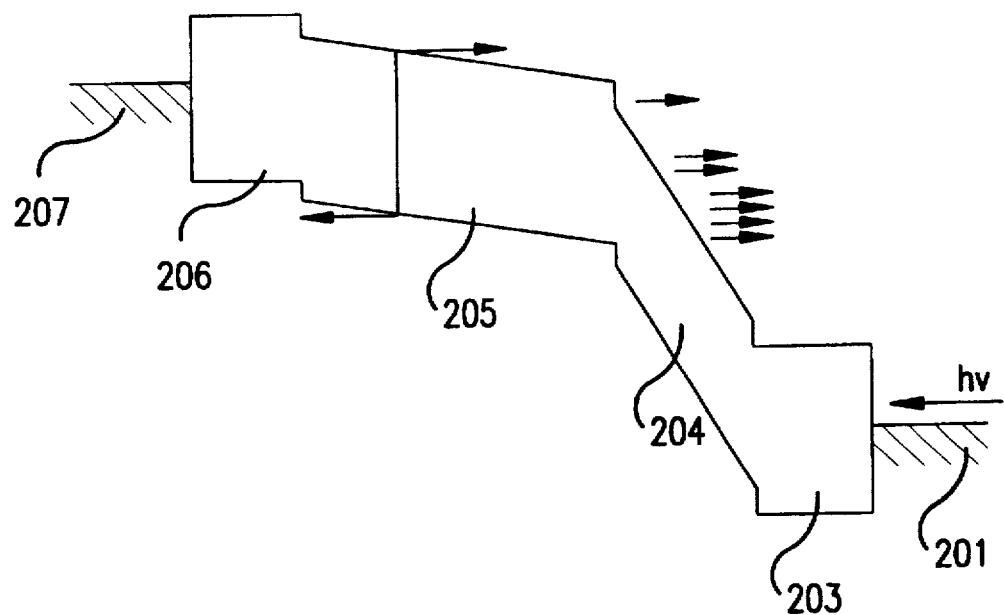
Figure 10A:
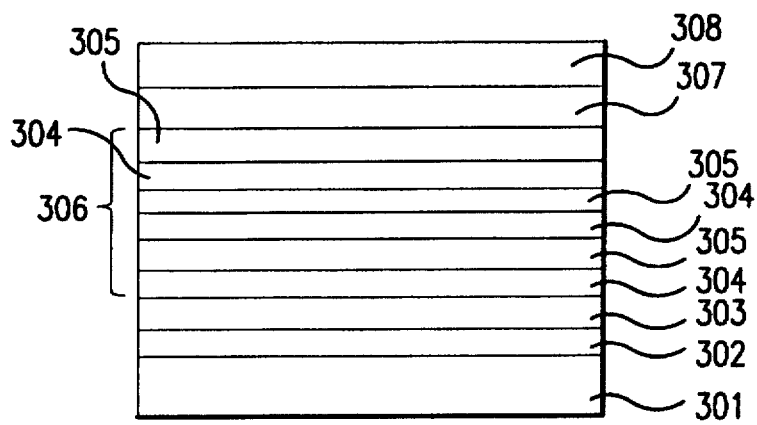
FIG. 10(a) is a schematic cross-sectional view illustrating the structure of the conventional amorphous Si-base APD, (b) is an energy band diagram illustrating the band structure of this APD at the time when no voltage is applied, and (c) is an energy band diagram illustrating the band structure of this APD at the time when reverse bias is applied.
Figure 10B:
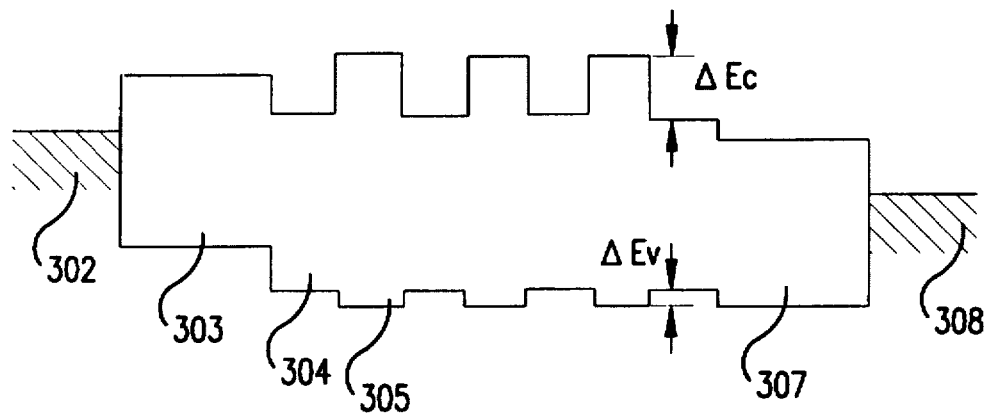
Figure 10C:
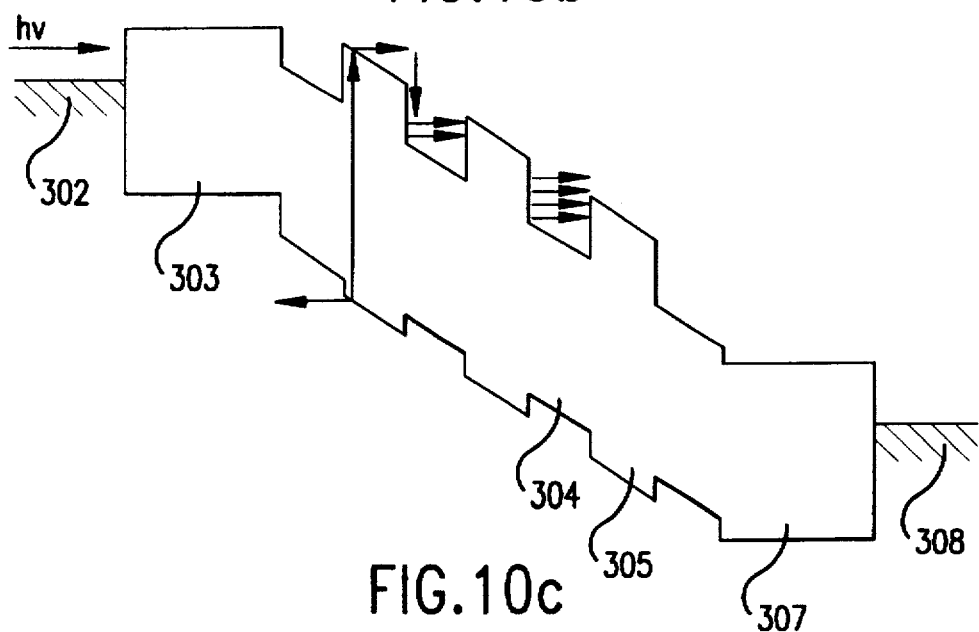

According to the structure of the above-described semiconductor photo detector, the band structure at the time when no voltage is applied is as illustrated in FIG. 8(b). Described specifically, the band discontinuity ΔEc at the hetero junction is 0.75 eV on the side of the conduction band. The ratio of energy which electrons receive at the hetero junction is larger, similar to Embodiment 6 (FIG. 7), than that of the semiconductor photo detector according to Embodiment 1 (FIG. 2). As a result, it is possible to actualize large multiplication effects and sensitivity increase.

The band discontinuity ΔEv in the valence band is, on the other hand, as small as 0.03 eV so that avalanche multiplication of holes does not occur and a high SN ratio similar to the semiconductor photo detector according to Embodiment 1 can be obtained.

In the semiconductor photo detector according to this embodiment, the bandgap of the carrier multiplication layer 176 is smaller than the bandgap of the optical absorption layer 173, so that the photo detector is desired to have a structure in which the electrode 177, the carrier multiplication 176, the optical absorption layer 173 and the transparent electrode 172 have been stacked in this order and incident light are irradiated from the side of the optical absorption layer 173.

Similar to the description in Embodiment 6, it is also possible to obtain similar effects to those described in Embodiments 2, 3, 4 and 5 by employing, as a super-lattice structure of the carrier multiplication layer 176, a stepwise potential structure and a saw-tooth potential structure and by disposing a buffer layer and a blocking layer, respectively.

What is claimed is:

1. In a semiconductor photo detector comprising, between two electrodes, at least one of said electrodes being a transparent electrode, an optical absorption layer which is composed of a non-single crystalline material, absorbs light and generates photo carriers and a carrier multiplication layer which is composed of a non-single crystalline material and multiplies the photo carriers generated by the optical absorption layer, the improvement wherein:

said carrier multiplication layer is formed of a multilayer film obtained by stacking films each having plural layers which are composed of non-single crystalline $Zn_xCd_{1-x}M$ ($0 \leq x \leq 1$, M represents one selected from the group consisting of S, Se and Te) and are different in a composition ratio in accordance with a change in the value of x in said $Zn_xCd_{1-x}M$.

2. A semiconductor photo detector according to claim 1, wherein said non-single crystalline material is an amorphous material, micro-crystalline material or polycrystalline material.

3. A semiconductor photo detector according to claim 1, wherein said carrier multiplication layer has a conduction band imparted with a saw-tooth potential structure by successively changing the value of x in $Zn_xCd_{1-x}S$ of each film forming said multilayer film.

4. A semiconductor photo detector according to claim 1, wherein said carrier multiplication layer has a conduction band imparted with a stepwise potential structure by successively changing the value of x in $Zn_xCd_{1-x}S$ of each film forming said multilayer film.

5. A semiconductor photo detector according to claim 1, wherein said optical absorption layer is formed of a non-single crystalline material comprising a compound of at least one material selected from the group consisting of Ge, C, N, O and H and Si.

6. A semiconductor photo detector according to claim 1, wherein a buffer layer is formed between said optical absorption layer and said carrier multiplication layer.

7. A semiconductor photo detector according to claim 6, wherein said buffer layer is formed of a non-single crystalline material comprising a compound of at least one material selected from the group consisting of C, N, O and H and Si.

8. A semiconductor photo detector according to claim 6, wherein said buffer layer has a film thickness of from 5 nm to 100 nm.

9. A semiconductor photo detector according to claim 1, wherein a blocking layer is formed between said carrier multiplication layer and said electrode contiguous thereto and/or between said optical absorption layer and said electrode contiguous thereto.

10. In a semiconductor photo detector comprising, between two electrodes, at least one of said electrodes being a transparent electrode, an optical absorption layer which is composed of a non-single crystalline material, absorbs light and generates photo carriers and a carrier multiplication layer which is composed of a non-single crystalline material and multiplies the photo carriers generated by the optical absorption layer, the improvement wherein:

said carrier multiplication layer is formed of a multilayer film obtained by stacking films each having plural layers which are composed of non-single crystalline $Zn_xCd_{1-x}M$ ($0 \leq x \leq 1$, M represents one selected from the group consisting of S, Se and Te) and are different in a composition ratio in accordance with a change in the value of x in said $Zn_xCd_{1-x}M$, and said electrode, said carrier multiplication layer, said optical absorption layer and said transparent electrode have been stacked in this order.

* * * * *